US012793930B2

(12) United States Patent
Noked et al.

(10) Patent No.: US 12,793,930 B2
(45) Date of Patent: Nov. 10, 2026

(54) CONOSCOPIC WAFER ORIENTATION APPARATUS AND ION IMPLANTER INCLUDING SAME

(71) Applicant: Applied Materials, Inc., Santa Clara, CA (US)

(72) Inventors: Ori Noked, Brookline, MA (US); Daniel A. Hall, West Windsor, VT (US); Frank Sinclair, Hartland, ME (US); Timothy Thomas, Portland, OR (US); Samuel Charles Howells, Portland, OR (US); Douglas E. Holmgren, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 18/794,728

(22) Filed: Aug. 5, 2024

(65) Prior Publication Data

US 2025/0095952 A1 Mar. 20, 2025

Related U.S. Application Data

(60) Provisional application No. 63/538,668, filed on Sep. 15, 2023.

(51) Int. Cl.
*H01J 37/20* (2006.01)
*H01J 37/147* (2006.01)
(Continued)

(52) U.S. Cl.
CPC .......... *H01J 37/20* (2013.01); *H01J 37/1472* (2013.01); *H01J 37/226* (2013.01); *H01J 37/244* (2013.01);
(Continued)

(58) Field of Classification Search
CPC ...... H01J 37/20; H01J 37/1472; H01J 37/226; H01J 37/244; H01J 37/3005;
(Continued)

(56) References Cited

U.S. PATENT DOCUMENTS 6,555,832 B1 4/2003 Ryding
6,992,311 B1 * 1/2006 Ring .................. H01J 37/3171 250/424

(Continued)

FOREIGN PATENT DOCUMENTS

JP 2014194352 A 10/2014
KR 1020230095140 A 6/2023

(Continued)

OTHER PUBLICATIONS

International Search Report and Written Opinion for International Application No. PCT/US2024/045113, mailed on Dec. 19, 2024, 12 pages.

*Primary Examiner* — David A Vanore
(74) *Attorney, Agent, or Firm* — KDW Firm PLLC

(57) ABSTRACT

An ion implanter, including an ion source generating an ion beam, a set of beamline components directing the ion beam to a substrate along a beam axis, normal to a reference plane, a process chamber housing the substrate to receive the ion beam, and a conoscopy system. The conoscopy system may include: an illumination source directing light to a substrate position, a first polarizer assembly, comprising a first polarizer element and first pair of lenses, disposed on opposite sides of the first polarizer element, and arranged to focus the light at the substrate position; a second polarizer assembly, disposed to receive the light after passing through the substrate position, including a second polarizer element and a second pair of lenses disposed on opposite sides of the
(Continued)

second polarizer element, and arranged to focus the light at a sensor, disposed in a detector plane of a detector.

20 Claims, 10 Drawing Sheets

(51) Int. Cl.

| | |
|---|---|
| ***H01J 37/22*** | (2006.01) |
| ***H01J 37/244*** | (2006.01) |
| ***H01J 37/30*** | (2006.01) |
| ***H01J 37/304*** | (2006.01) |
| ***H01J 37/317*** | (2006.01) |

(52) U.S. Cl.
CPC ...... *H01J 37/3005* (2013.01); *H01J 37/3045* (2013.01); *H01J 37/3171* (2013.01); *H01J 2237/2007* (2013.01); *H01J 2237/20207* (2013.01); *H01J 2237/20214* (2013.01); *H01J 2237/2441* (2013.01); *H01J 2237/2446* (2013.01)

(58) Field of Classification Search
CPC ............... H01J 37/3045; H01J 37/3171; H01J 2237/2007; H01J 2237/20207; H01J 2237/20214; H01J 2237/2441; H01J 2237/2446
See application file for complete search history.

(56) References Cited

U.S. PATENT DOCUMENTS

| | | | | |
|---|---|---|---|---|
| 7,375,355 | B2 * | 5/2008 | Ferrara | H01J 37/16 257/E21.336 |
| 7,994,488 | B2 * | 8/2011 | Huang | H01J 37/3171 250/397 |
| 9,807,864 | B1 * | 10/2017 | Lupoli | H01J 37/3171 |
| 10,763,071 | B2 | 9/2020 | Sinclair | |
| 11,699,570 | B1 | 7/2023 | Charnvanichborikarn | |
| 2005/0230642 | A1 | 10/2005 | Halling | |
| 2008/0061250 | A1 * | 3/2008 | Perel | H01J 37/3171 250/492.21 |
| 2010/0012031 | A1 | 1/2010 | Torregrosa | |
| 2012/0001087 | A1 * | 1/2012 | Radovanov | H01J 37/12 250/396 R |
| 2017/0221678 | A1 * | 8/2017 | Likhanskii | H01J 37/3007 |
| 2021/0020399 | A1 * | 1/2021 | Likhanskii | H01J 37/12 |
| 2022/0102112 | A1 * | 3/2022 | Ninomiya | H01J 37/304 |
| 2025/0095958 | A1 * | 3/2025 | Sinclair | H01J 37/20 |

FOREIGN PATENT DOCUMENTS

| | | | | |
|---|---|---|---|---|
| KR | 20230148275 A * | 10/2023 | | H01J 37/147 |
| WO | WO-2017136096 A1 * | 8/2017 | | H01J 37/3171 |
| WO | WO-2025058893 A1 * | 3/2025 | | H01J 37/20 |

* cited by examiner

CONOSCOPIC WAFER ORIENTATION APPARATUS AND ION IMPLANTER INCLUDING SAME

RELATED APPLICATIONS

This application claims priority to U.S. provisional patent application Ser. No. 63/538,668, filed Sep. 15, 2023, entitled CONOSCOPIC WAFER ORIENTATION FOR ION IMPLANTATION, the contents of which application are incorporated by reference herein in their entirety.

FIELD

The present embodiments relate to ion implantation, and more particularly to substrate orientation in ion implanters.

BACKGROUND

Silicon Carbide has emerged as one of the most promising materials for high voltage, high power switching applications. The SiC compound is readily formed in many different crystal structures, each with their own crystallographic and electronic properties. The most popular SiC material is the "4H" polytype, which structure has hexagonal symmetry and a pattern of hexagonal layers that repeats every 4 layers: ABCBABCBABC . . . . This crystal belongs to the $P6_3mc$ or $C^4_{6v}$ space group. In a hexagonal crystal, the crystalline structure is characterized by a set of axes where an a-axis and a b-axis are equal in dimension to one another and extend perpendicularly to a c-axis, which axis has a different dimension than the a-axis and b-axis. To form monocrystalline 4H SiC wafers, SiC crystalline boules are typically grown at very high temperatures by vapor phase deposition. In order to maintain the polytype structure and minimize defects, the growing surface may be tilted at 4° to the c-axis. Since the growth forms a roughly cylindrical boule whose length is much shorter than the diameter of the boule, to cut the maximum number of wafers from the SiC boule, the wafers are also cut approximately parallel to the growth surface.

The manufacture of high voltage devices entails the creation of regions several microns thick that are depleted of any charge carriers and thus able to withstand high voltages without significant current. One of the best methods to achieve these regions is through deep ion implantation. For a given crystalline substrate, the depth of an ion implant is principally determined by the energy and mass of the ions, but can be significantly modified by the alignment of the ion trajectories with the crystal structure of the substrate. In SiC substrates these alignment effects have a much greater impact than for silicon substrates, because of the potential energy due to the alternating silicon and carbon atoms in the structure and the lower symmetry of the crystal. In some examples, the implantation depth of ions may vary up to 100% or more, depending upon the orientation of the silicon carbide crystal. Also, the amount of crystal damage caused may be reduced significantly by aligning the ion beam with the crystal direction. Thus, in the processing of silicon carbide devices, knowledge of the crystal orientation becomes extremely important.

With respect to these and other considerations the present embodiments are provided.

SUMMARY

In one embodiment, an ion implanter is provided, including an ion source to generate an ion beam, a set of beamline components to direct the ion beam to a substrate along a beam axis that is normal to a reference plane, a process chamber to house the substrate to receive the ion beam, and a conoscopy system, disposed within the ion implanter. The conoscopy system may include an illumination source to direct light to a substrate position, and a first polarizer assembly, being disposed between the illumination source and the substrate position, and comprising a first polarizer element and a first pair of lenses that are disposed on opposite sides of the first polarizer element, and are arranged to focus the light at the substrate position. The conoscopy system may also include a second polarizer assembly, the second polarizer assembly being disposed to receive the light after passing through the substrate position, the second polarizer comprising a second polarizer element and a second pair of lenses disposed on opposite sides of the second polarizer element, and arranged to focus the light at a detector plane. The conoscopy system may further include a detector, to detect the light after passing through the lens, the detector having a sensor that is disposed at the detector plane.

In a further embodiment, a method of implanting a substrate is provided. The method may include determining an offset angle for the substrate using a conoscopy system coupled to ion implanter. The method may further include generating an ion beam in the ion implanter, directing the ion beam to a substrate along a beam trajectory; and tilting the substrate with respect to the beam trajectory based upon the offset angle, when the ion beam impinges upon the substrate.

In another embodiment, an optical module is provided, for orienting a substrate in an ion implanter. The optical module may include an illumination source to direct light to a substrate position. The optical module may include a first polarizer assembly, disposed between the illumination source and the substrate position, and comprising a first polarizer element and a first pair of lenses that are disposed on opposite sides of the first polarizer element, and are arranged to focus the light at the substrate position. The optical module may further include a second polarizer assembly, the second polarizer assembly being disposed to receive the light after passing through the substrate position, the second polarizer comprising a second polarizer element and a second pair of lenses disposed on opposite sides of the second polarizer element, and are arranged to focus the light at a detector plane. The optical module may also include a detector, to detect the light after passing through the lens, the detector having a sensor that is disposed at the detector plane.

DETAILED DESCRIPTION

Figure 2:
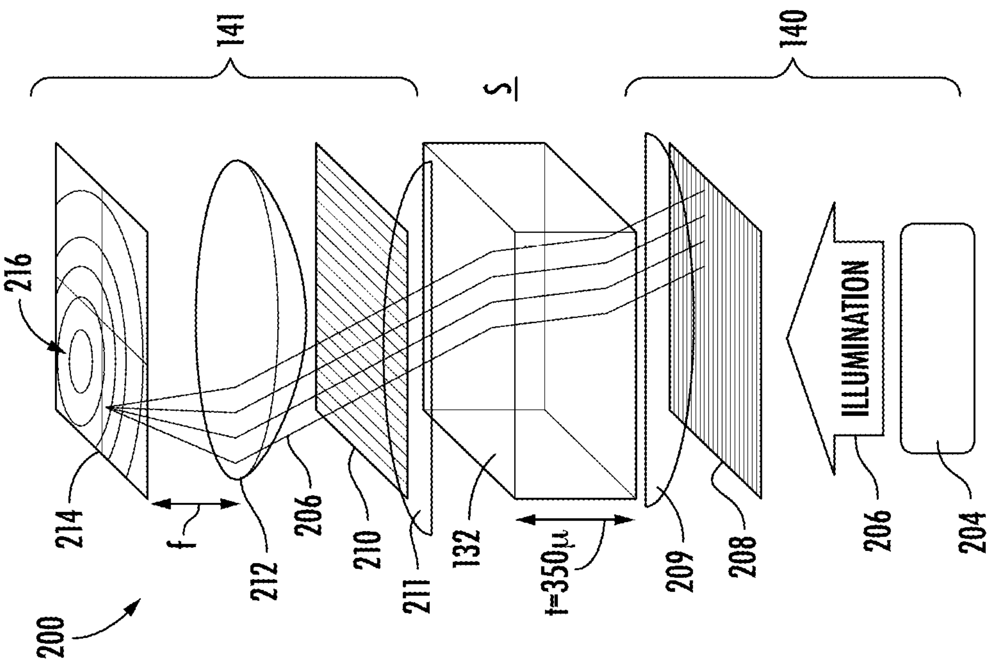
FIG. 2 shows an example of a conoscopy system, according to an embodiment of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to apparatus and techniques for improved substrate ion implantation. The present embodiments employ novel ion implantation systems, also referred to herein as ion implanters, which implanters incorporate a conoscopy system to provide insitu accurate substrate orientation. In various embodiment, the substrate orientation may be performed so as to align the crystallographic structure of the substrate to present a so-called channeling orientation with respect to an ion beam that is used to implant the substrate. In so doing, the implant profile and in particular, the implant depth of the ions of the ion beam may be substantially increased for a given ion energy and given substrate.

Figure 1:
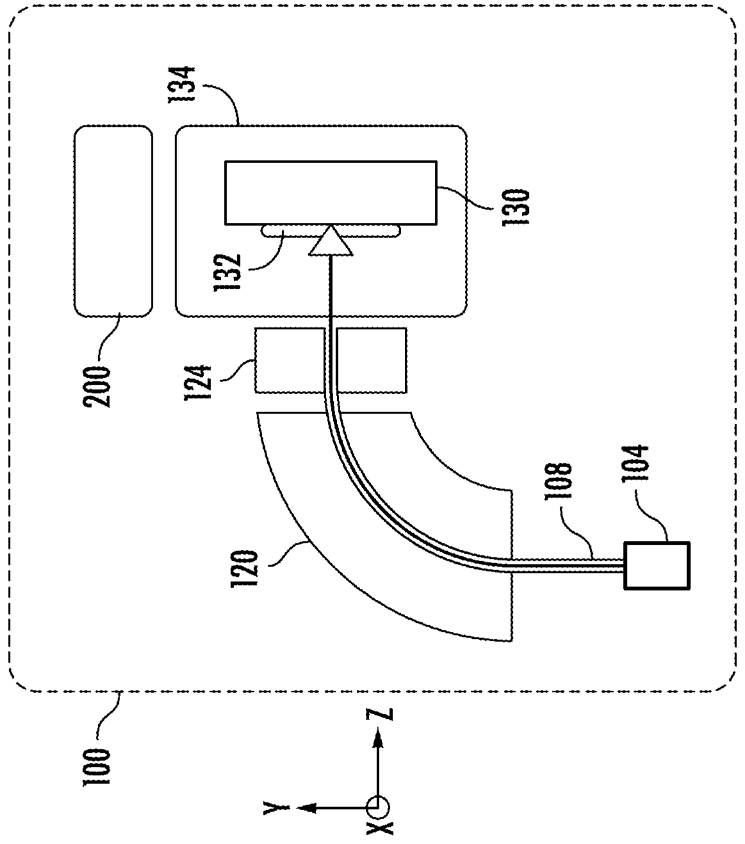
FIG. 1 depicts an exemplary ion implantation system in accordance with embodiments of the present disclosure.

Referring now to FIG. 1, an exemplary system in accordance with the present disclosure is shown. The ion implantation system 100 represents a beamline ion implanter containing, among other components, an ion source 104 for producing an ion beam 108, and a series of beam-line components, disposed between the ion source 104 and a substrate 132. The ion source 104 may comprise a chamber for receiving a flow of gas, or a solid target, and generating ions therein. The ion source 104 may also comprise a power source and an extraction electrode assembly disposed near the chamber. The beam-line components may include, for example, a mass analyzer 120, and other beamline components, as known in the art. These other beamline components are represented by downstream components 124, and may include acceleration or deceleration stages, a collimator, a mass resolving slit, a scanner, energy filter, and/or other suitable downstream beamline components (not shown), to accelerate the ion beam 108, decelerate the ion beam 108, shape the ion beam 108, scan the ion beam 108, and so forth.

The ion beam 108 may be directed toward a substrate 132 mounted on a substrate holder 130, and disposed within a process chamber, which process chamber may be part of an end station 134, or adjacent to the end station 134. As appreciated, the substrate may be moved using a control mechanism in one or more dimensions and type of motions (e.g., translate, rotate, and tilt).

In various embodiments, different species may be used as the source and/or the additional material. Examples of the source and/or additional material may include atomic or molecular species containing boron (B), carbon (C), nitrogen (N), oxygen (O), germanium (Ge), phosphorus (P), aluminum (Al), arsenic (As), silicon (Si), helium (He), neon (Ne), argon (Ar), krypton (Kr), Xenon (Xe), Gallium (Ga), magnesium (Mg), platinum (Pt), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

Although non-limiting, the ion source 104 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 104 may generate the ion beam 108 for implanting into substrate 132. In various embodiments, the ion beam 108 (in cross-section) may have a targeted shape, such as a spot beam or ribbon beam, as known in the art. In the Cartesian coordinate system shown, the direction of propagation of the ion beam 108 may be represented as parallel to the Z-axis, while the actual trajectories of ions with the ion beam 108 may vary. In order to implant into the substrate 132, the ion beam 108 may be accelerated to acquire a target energy by establishing a voltage (potential) difference between the ion source 104 and the substrate 132, or by other means of acceleration such as used in linear accelerators.

As further shown in FIG. 1, the ion implantation system 100 may include apparatus to perform conoscopic measurement of the substrate 132, which apparatus is depicted as conoscopy system 200. In some embodiments, the conoscopy system 200 may be partially or wholly located in a part of the ion implantation system 100 that is separate from the end station 134, while in other embodiments, the conoscopy system may be integrated at least partially, within the end station 134. Moreover, the conoscopy system may be located outside of a process chamber that receives an ion beam, but is located within other locations in the end station 134. For example, according to some non-limiting embodiments, the conoscopy system 200 may be located in an existing load lock of the ion implantation system 100, may be located in an orienter than orients the substrate 132, or within a process chamber portion of the end station 134, or in an optical system that is affixed to a portion of the ion implantation system 100.

FIG. 2 shows an example of a variant of the conoscopy system 200, according to an embodiment of the disclosure. In FIG. 2, an arrangement of the conoscopy system 200 is shown, including a lower part 140 designed to produce suitable illumination of the substrate 132 with a converging beam of polarized light, and an upper part 141 designed to produce a conoscopic image. As will be understood, the substrate 132 may be manipulated while in the conoscopy system 200 in order to perform measurements that indicate the crystallographic orientation of the substrate 132. As shown, the conoscopy system 200 may include an illumination source 204, which source may be a visible light source, or an ultraviolet (UV) light source, according to some non-limiting embodiments. The conoscopy system 200 may further include a first polarizer 208, having a first polarization axis, which axis may be deemed to lie along a Y-axis, for the purposes of illustration. The first polarizer 208 is disposed between the illumination source 204 and the substrate position S. As such, radiation, such as a beam of radiation, or other shape of radiation generated from illumination source 204, and referred to as light 206, that passes into the substrate 132, when located at the substrate position S, will first pass through the first polarizer 208. Note that this light 206 may be collimated and may pass first through a condenser lens 209 that focuses the light 206 at the substrate position S. The conoscopy system 200 may further include a second polarizer 210, having a second polarization axis that is oriented at a right angle with respect to the first polarization axis, such as along an X-axis that is orthogonal to the Y-axis. Note that an objective lens 211 may be provided between the substrate position S and the second polarizer, to collimate the light 106. As shown, the second polarizer 210 is disposed to receive the light 206 after passing through the substrate position S. The conoscopy system 200 may further include a lens 212, disposed to receive the light 206 after passing through the second polarizer 210.

The conoscopy system 200 may further include a two dimensional detector, shown as detector 214, to detect the light 206 after passing through the lens 212, which lens images the conoscopic interference pattern onto the detector 214. The detector 214 may be any suitable detector to detect a pattern of polarized and focused light as known in the art. In some embodiments, the detector 214 may form a two-dimensional image or pattern suitable for interpretation by a computer algorithm. In this conoscopic approach, the imaging lens (lens 212) is positioned so that an image sensor (see detector 214) is in a detector plane that forms the back focal plane of the lens and thus each point in the image corresponds to one angle of propagation of the light through the substrate 132. Said another way, the "camera" formed by the lens and the image sensor is focused at infinity so that the detected image is not a conventional image of the sample, but is a conoscopic interference image of the angles of light in the crystal.

Advantageously, the conoscopy system 200 may be employed to accurately determine crystallographic orientation of a substrate, especially for a monocrystalline substrate that is optically birefringent. As an example, the 4H polytype of SiC, also referred to herein as "4H SiC" crystallizes in the $P6_3mc$ space group, representing a hexagonal crystal structure, and is strongly optically birefringent (uniaxial). The optical birefringence is reflected in a significantly lower index of refraction for light rays that travel along the c-axis of the crystal (the "ordinary" direction), than the index of refraction for rays travelling at right angles to this axis, with an electric vector along the c-axis (the "extraordinary" direction.)

For light rays having electric vectors at intermediate angles, light entering the 4 h SiC crystal will split into two wave fronts that will then propagate through the crystal at different wavelengths, recombining when the wavefronts emerge back into air (or vacuum). Since the two components will have a phase shift when recombined, this effect will rotate the plane of polarization. This rotation of the polarization can easily be detected by the use of the condenser lens 209, the objective lens 211, and a pair of crossed polaroid filters, as embodied in the first polarizer 208 and second polarizer 210. Thus, just light where the direction of polarization has been rotated will pass through the second polarizer 210, while light that has not had the plane of polarization rotated will be absorbed by the second polarizer and those parts of the image will appear as a black cross (an isogyre) in the conoscopic image. One other condition may occur when the plane of polarization has been rotated by exactly 180°, or an integral product of 180°, in which case the second polarizer will again block the light and produce a series of concentric dark circles (isochromes).

In the embodiments detailed herein, the figures and description are most suitable for the case of measuring orientation in a uniaxial crystal with no strain. In a biaxial crystal, where the indicatrix has three different axes, the conoscopic images produced are more complicated: the isogyres appear as a single dark stripe across the field of view, and the isochromes become ellipsoidal. In crystals with strain, the images are further distorted by piezo-optical effects. In other embodiments of the disclosure, the operation of the conoscopic system disclosed herein can be extended to these more complicated situations by interpreting the image and matching it to a model that includes these complicating effects.

The conoscopy system 200 may thus be effectively used to examine a birefringent substrate such as 4H SiC, or other known birefringent materials. Note that according to various embodiments, some components of the conoscopy system 200 may be arranged similarly to known conoscopy systems, and may include microscopy components to provide modest magnification, with the objective lens focused at infinity rather than at a sample position. In this manner, every position of an image 216, formed on the detector 214 may correspond to the direction of the light 206, rather than a position on the sample. Thus, the components of the conoscopy system 200 may be employed to identify the direction of the optical axis of a substrate 132, such as 4H SiC, with respect to any suitable geometric reference system, such as a Cartesian coordinate system used to handle and orient substrates in the ion implantation system 100. Once the orientation of the optical axis of the substrate 132 is known, the substrate 132 may be suitably positioned for implantation in the end station 134, such as being place in an orientation to promote ion channeling along the c-axis of the substrate 132.

Figure 3:
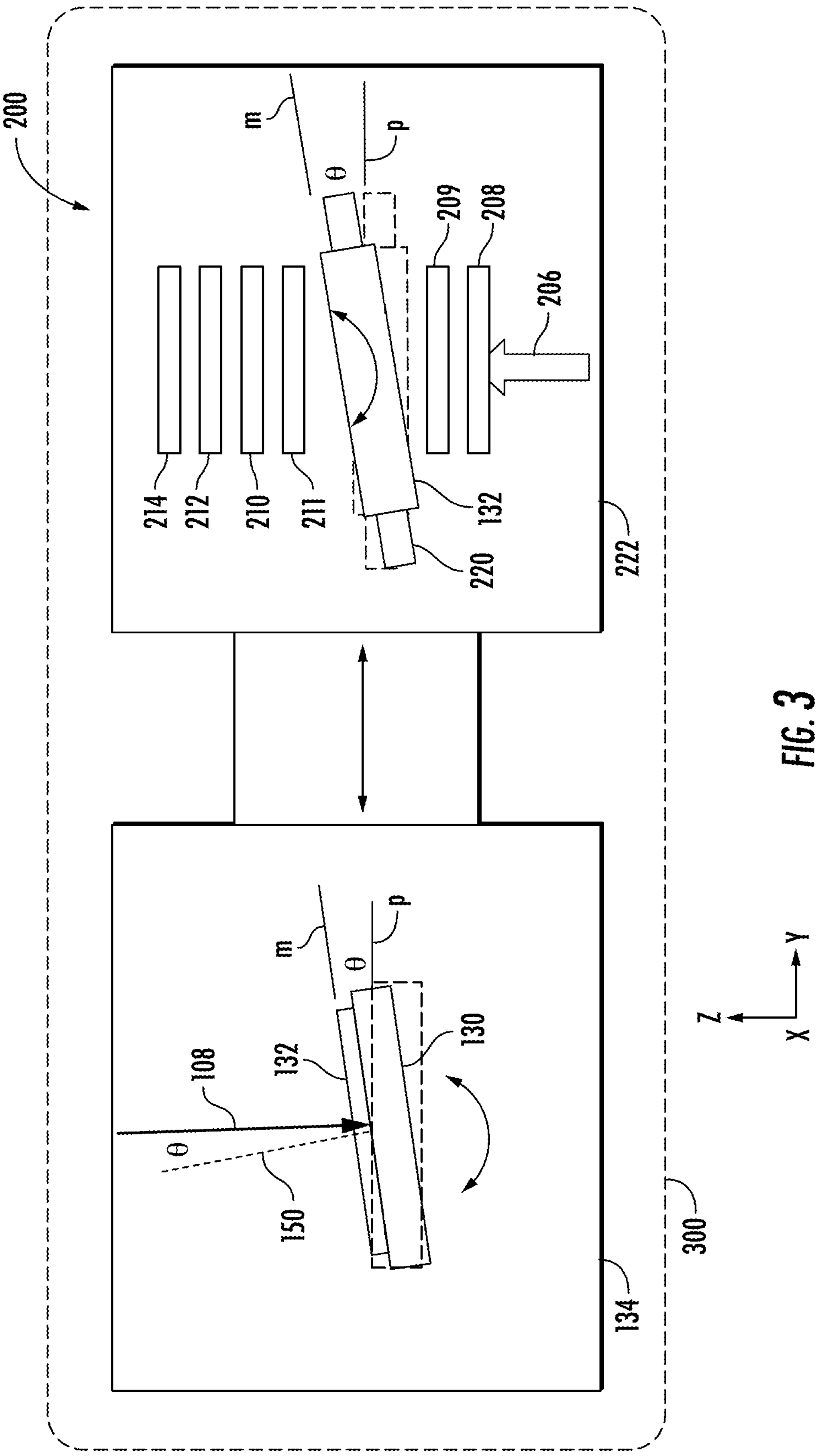
FIG. 3 depicts details of an exemplary ion implantation system in accordance with other embodiments of the present disclosure.

FIG. 3 depicts details of an exemplary ion implantation system in accordance with other embodiments of the present disclosure. The ion implantation system 300 may include known components of an ion implanter, such as those components detailed above with respect to FIG. 1. In the view of FIG. 3, just the end station 134 and conoscopy system 200 are shown.

In the embodiment shown in FIG. 3, the conoscopy system 200 is located in a part of the ion implantation system, denoted as a chamber 222, that is separate from the process chamber in the end station 134. However, as noted above, in other embodiments, the conoscopy system 200 may be integrated, at least partially, within process chamber of the end station 134 that receives the implanting ion beam In this embodiment, the conoscopy system 200 may further include a substrate stage 220, to hold the substrate 132 at the substrate position S. In an untilted configuration, represented by the dashed lines, a main plane of the substrate 132, such as a plane corresponding to a top surface of the substrate 132, may be used to define a reference plane P. For sake of illustration, the reference plane P may correspond to the X-Y plane of the Cartesian coordinate system shown. The substrate stage 220 may include two adjustable angle components to tilt and rotate (also referred to as twist) the substrate 132 so that, in the case of tilt, the main plane m defines a non-zero angle with respect to reference plane P. The tilt angle may be shown as θ in FIG. 3, while rotating the substrate around the normal 150 to the substrate by a twist angle φ. By tilting and twisting the substrate stage 220 so as to vary a value of θ, the detector 214 may be monitored to determine an orientation, also referred to herein as an offset orientation. This offset orientation may correspond to the orientation of substrate 132 that provides a maximum channeling of ions of ion beam 108 when the substrate 132 is transferred to end station 134 and ion implantation is commenced. Thus, by determining the optimum values of φ and θ in the conoscopy system 200, the substrate 132 may be oriented with this same optimum value of φ and θ, when located in the end station, so as to promote channeling of the ion beam 108.

Note that the tilt angle θ may also be equivalent to an incidence angle of the ion beam 108, as defined with respect to the normal 150. Thus, because the ion beam 108 may form a trajectory that is aligned along a normal to the when oriented a suitable value of θ, with respect to reference plane P, when the substrate 132 is oriented at a proper value of θ, the ion beam 108 will impinge upon the surface of the substrate 132 at a trajectory that defines the same value of with respect to the normal 150. Since the c-axis of the crystal forming the substrate 132 may be aligned at the angle θ with respect to normal 150, the ion beam 108 may enter into the substrate 132 parallel to the C-axis and thus along a so-called channeling direction, assuming a proper twist angle alignment.

Figure 9:
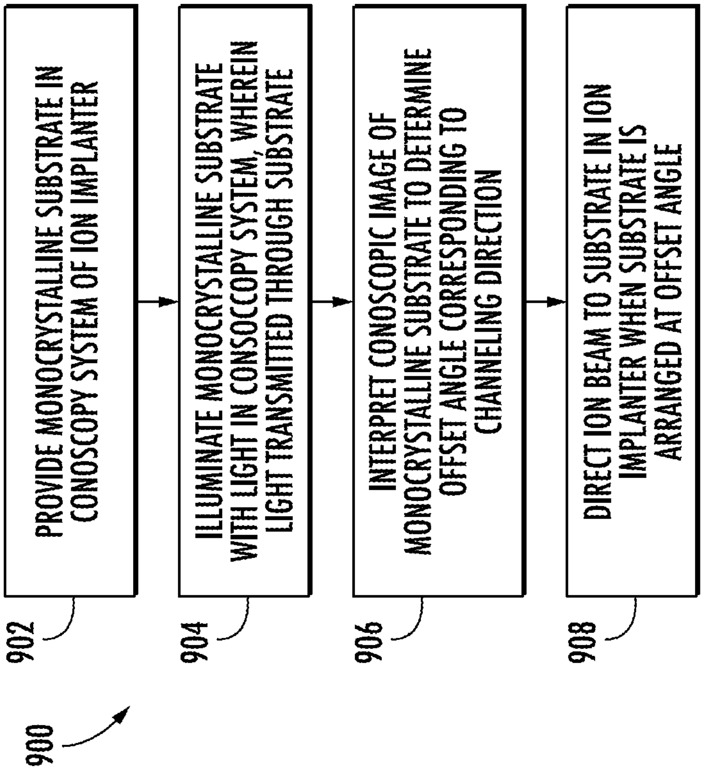
FIG. 9 depicts another exemplary process flow.

According to different embodiments of the disclosure, several modes of operation are possible. For a crystal having uncertain optical properties, it may be advantageous to analyze the image of isogyres and isochromes for different tilt angles θ at one location and then by observing the relative shift of the image measure the refractive index of the material, as well as the inclination of the optical axis to the normal of the surface. For a crystal of known optical properties and with a well aligned optical system, it is possible to determine the tilt angle θ and twist angle φ by locating the isogyres and isochromes in the image plane with no motion of the crystal required, as shown in FIG. 9, described in more detail below. For a crystal having significant inhomogeneities or strain, it may be advantageous to make the measurement at several different positions (x,y) to explore possible variations in the direction of the optical axis across the wafer, so that an average angle could be used for the ion implantation. If the angle variation across the wafer is significant it may be advantageous to vary the direction of the ion beam in some systematic way as a function of x and y across the face of the wafer (meaning the main surface of a substrate) to compensate for wafer crystal distortion.

In another embodiment, one mode of operation that may be particularly effective and impose a minimum added delay in wafer processing is described in the following scenario. Note that existing practice for wafer handling before a given implant procedure, is to use a separate station in the vacuum chamber (separate from an endstation where wafer implantation takes place) to identify the twist angle of the notch or flat that wafer manufacturers use to indicate the crystal alignment. This station already has a rotating support for the wafer and a light sensor that produces a signal at the notch or flat on the edge of the wafer. In this new embodiment, this same station may be equipped with the conoscopic inspection system of the present embodiments, where the system can image the interference pattern at, e.g., four rotation angles by sighting through the edge of the wafer. Given knowledge of the refractive index and the birefringence of the wafer material, each image may be interpreted to produce the desired tilt and twist angles for the implant, which tilt/twist information may then be fed forward to the implant end-station controller to allow the positioning of the wafer for implant. The use of several independent positions on the wafer for the inspection will provide an accuracy check, as well as allowing for the detection of wafers with significant strain and variation of crystal axes.

Alternatively, in another embodiment, the conoscopy measurement can be done on one spot at the center of the wafer and several, e.g. four, rotation angles can be measured for the same location. While there may be less broad sampling of the wafer in this latter embodiment, the advantages of this embodiment include less wafer distortion such as bowing at the center of the wafer, and potential clearance from obstruction such as devices and masks. By measuring the same spot while arranged at several orientations, we can increase the precision of the measurement and compensate for small misalignments.

Figure 5:
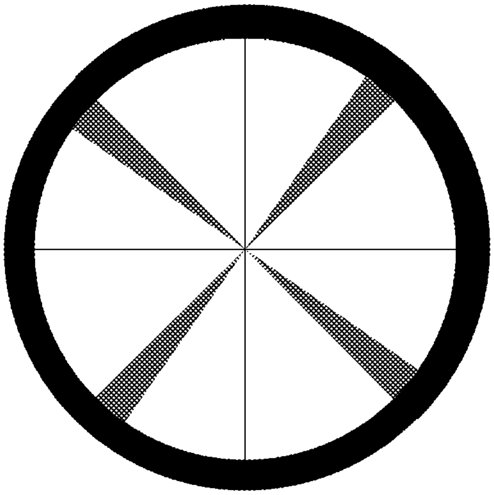
FIG. 4 and FIG. 5 together show an example of conoscopy imaging to determine substrate alignment.
Figure 4:
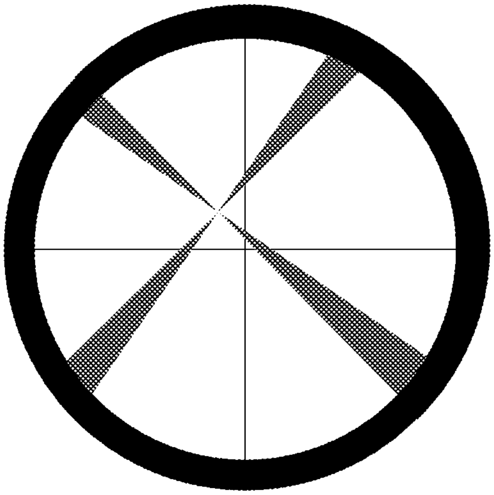

FIG. 4 and FIG. 5 show an example of conoscopy imaging to determine substrate alignment. In FIG. 4, a microscopic image is presented representing a possible conoscopic pattern. The image of FIG. 4 may represent an image plane where every point in the image plane corresponds to an angle of propagation through the crystal being measured. The dark triangular regions may represent isogyres that are composed of dark bands where just one wave propagates through the crystal. In FIG. 4, the isogyres are not convergent at the center of the cross pattern, indicating misalignment of the crystal, while in FIG. 5, the isogyres tips do converge at the center of the cross pattern, forming a symmetrical pattern, indicating alignment.

Figure 6:
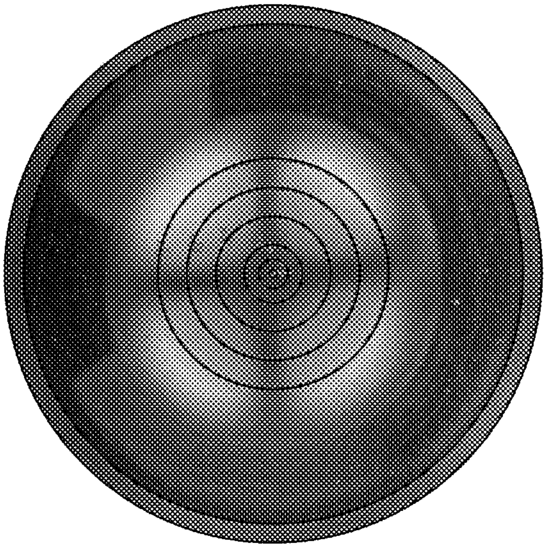
FIG. 6 shows another example of conoscopy imaging to determine substrate alignment.

FIG. 6 shows another example of conoscopy imaging to determine substrate alignment. In this example, the crystal being measured is a ruby crystal (corundum crystal structure), which structure is a hexagonal (or trigonal) type of crystalline lattice. The isogyres are generally aligned to the center of the image, indicating alignment, with some distortion in the isogyre, likely caused by twinning or strain in the ruby sample.

Referring again to FIG. 3, an advantage afforded by the ion implantation system 300 is that a substrate, such as a monocrystalline substrate that exhibits birefringence, can be readily tilted to present a substrate surface that is oriented to improve channeling just before implantation commences, using an in-situ conoscopic system. Note that for some materials, and especially for 4H SiC, the implantation depth of ions may be very sensitive to substrate orientation, such that small changes in substrate orientation may substantially change the implantation depth. Moreover, as noted previously, the substrate surface (main plane) of such 4H SiC substrates may oriented at several degrees off axis so that the c-axis is not oriented at a normal to substrate surface. Thus, when an offcut 4H SiC substrate is placed in an implanter at a nominally horizontal orientation, where the Z-axis is parallel to the ion beam, and the main plane of the substrate is parallel to the X-Y plane, the ion beam will enter the substrate along a trajectory that is not parallel to the c-axis of the 4H SiC crystalline lattice. The ion beam will therefore not enter the 4H SiC lattice along a channeling direction, thus reducing the potential implant depth of implanting ions. Moreover, the exact amount of offcut of the substrate surface with respect to the c-axis may not accurately be known a priori. Therefore, the timely and accurate tilting of the substrate 132 to align the c-axis of the crystalline lattice with the trajectory of the ion beam 108 may be harnessed to great advantage by the ion implantation system 300.

To emphasize the above points, and by way of reference, the inventors note that the effect of substrate offset angle on ion depth profile for aluminum ion implantation into 4H SiC has previously been reported. The results for aluminum ion implantation showed that at 8 or 9 degrees of tilt, the penetration of the ions is approximately half as much as for ions aligned with the c-axis, corresponding to the channeling orientation. Accordingly, it can be expected that misorientation of the c-axis of 4H SiC wafer of even a fraction of a degree may substantially reduce ion penetration into the 4H SiC wafer. For higher energy, and thus deeper, channeling implants, a higher precision in the orientation of the c-axis of 4H SiC wafer is required. The higher the implant energy, the higher the required precision.

While in principle a conoscopy system may be used to properly orient a substrate in an ion implanter to improve channeling, a drawback of the application of a conoscopy system for measuring substrates such as 4H SiC is that the accuracy of the determination of ideal offset angle to orient the substrate with c-axis alignment will decrease with decreasing thickness of a substrate. For example, practical thicknesses of substrates used for power semiconductor application may be in the range of several hundred micrometers. At this thickness, the resulting conoscopic images may provide less accuracy for determining c-axis alignment than is provided with other techniques, such as X-ray diffraction (XRD).

Figure 7A:
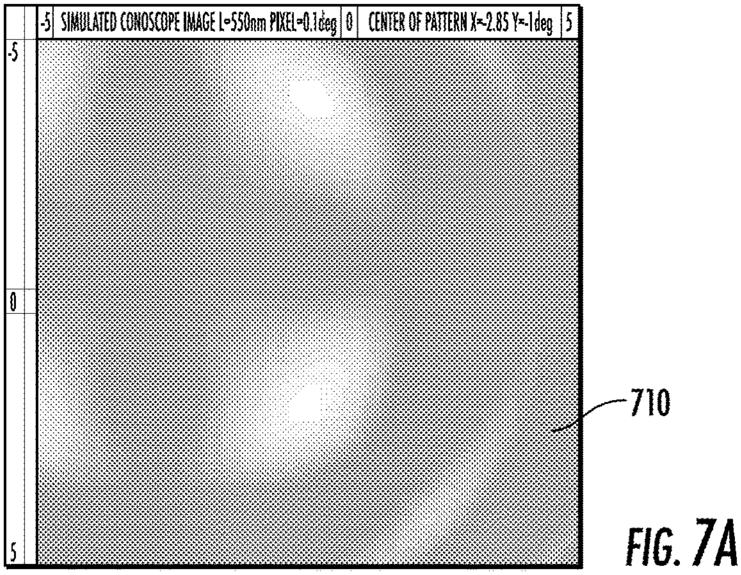
FIG. 7A is a simulated conoscopy pattern for a 4H SiC illuminated with 550 nm wavelength radiation.
Figure 7B:
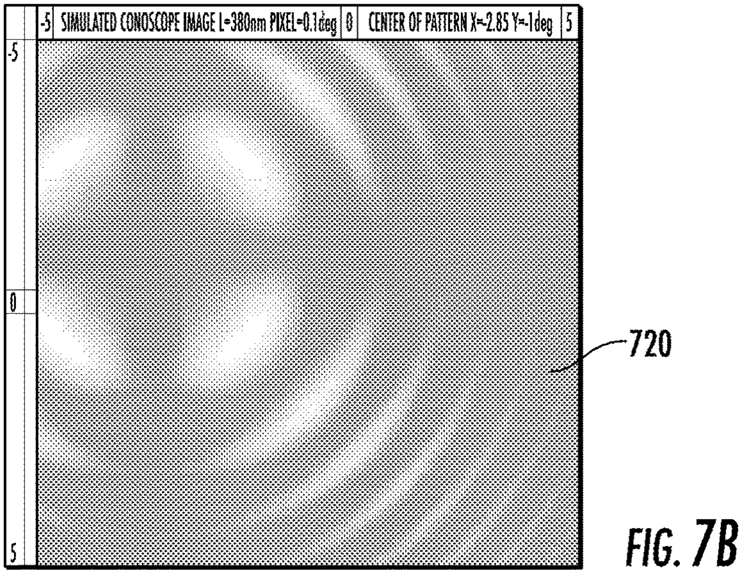
FIG. 7B is a simulated conoscopy pattern for a 4H SiC illuminated with 380 nm wavelength radiation.
Figure 7C:
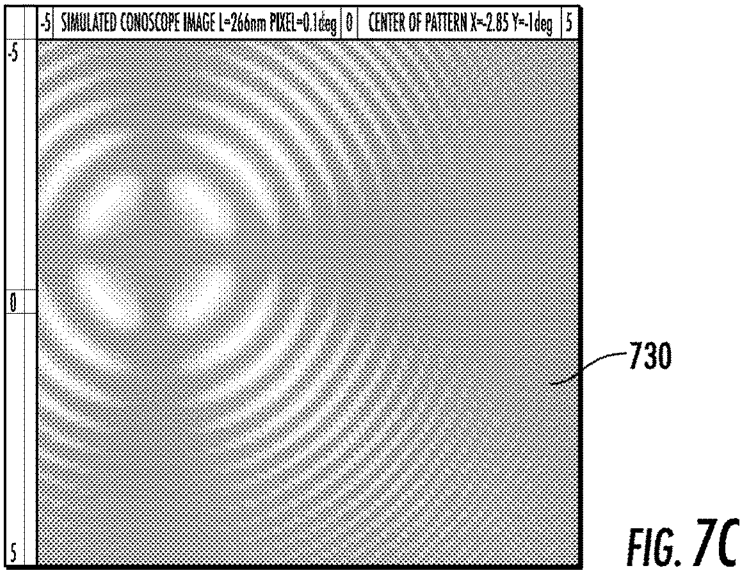
FIG. 7C is a simulated conoscopy pattern for a 4H SiC illuminated with 266 nm wavelength radiation.

To address this issue, the present inventors have determined that decreasing the wavelength of incident radiation used to perform the conoscopic alignment procedures as outlined above may provide substantial improvement in measurement accuracy. To illustrate the improvement possible by reducing wavelength, FIG. 7A is a simulated conoscopy pattern for a 4H SiC illuminated with 550 nm wavelength radiation; FIG. 7B is a simulated conoscopy pattern for a 4H SiC illuminated with 380 nm wavelength radiation; and FIG. 7C is a simulated conoscopy pattern for a 4H SiC illuminated with 266 nm wavelength radiation. It should be noted that working with 266 nm wavelength may be challenging because of the significantly higher absorption of the 4H SiC material itself, as well as additional safety and operational considerations. In particular, each of the patterns of these figures represents a pixelated simulated image that employs a simple model using 0.1° pixels distributed over ±5°. Note that a full frame 35 mm SLR camera with 200 mm lens has ±5° field of view, so the model of these figures is within practical implementation. However, in the sample of FIG. 7A, with 500 nm wavelength, location of the center of the pattern 710 may be difficult, at least to a desired accuracy less than 0.1 degrees. Fitting the conoscopic interference pattern can easily provide sub-pixel resolution and satisfy the precision requirement for practical implementation.

Turning to FIG. 7B, at the relatively shorter wavelength of 380 nm, the frequency of the pattern 720 increases for two reasons: the refractive index and birefringence of the SiC crystalline material increases, and the number of wavelengths within a SiC wafer increases. In this example, with proper image processing, location of the center of the pattern 720 to within one pixel (meaning to within 0.1 degree) may be possible. Additionally, fitting the conoscopic interference pattern can easily provide sub-pixel resolution and satisfy the precision requirement for practical implementation.

Turning to FIG. 7C, at 266 nm (UV wavelengths), the pattern 730 is sufficiently detailed that location of the center and orientation of a crystal to within <0.1 degrees is readily achievable. However, the transmissivity of SiC substrates at this wavelength may limit use of this approach and the cost of the instrumentation needed may be too high. In view of the above, operation at violet or near UV wavelengths in the range of (375 nm to 450 nm) may be useful for a conoscopy system of the present embodiments.

Figure 7D:
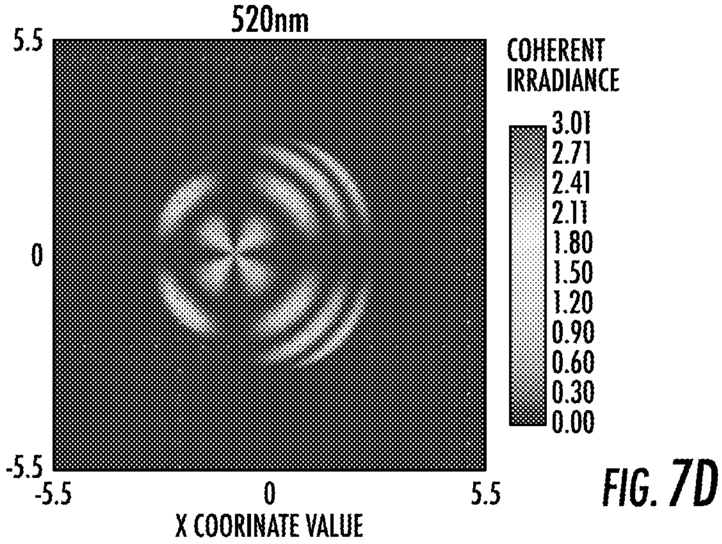
FIG. 7D is a simulated conoscopy pattern for a 4H SiC illuminated with 550 nm wavelength radiation using a special optical software.
Figure 7E:
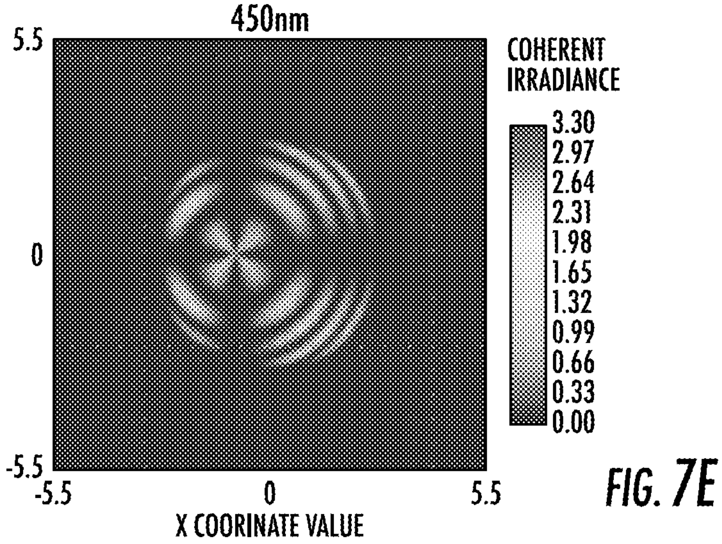
FIG. 7E is a simulated conoscopy pattern for a 4H SiC illuminated with 450 nm wavelength radiation using the software of FIG. 7D.
Figure 7F:
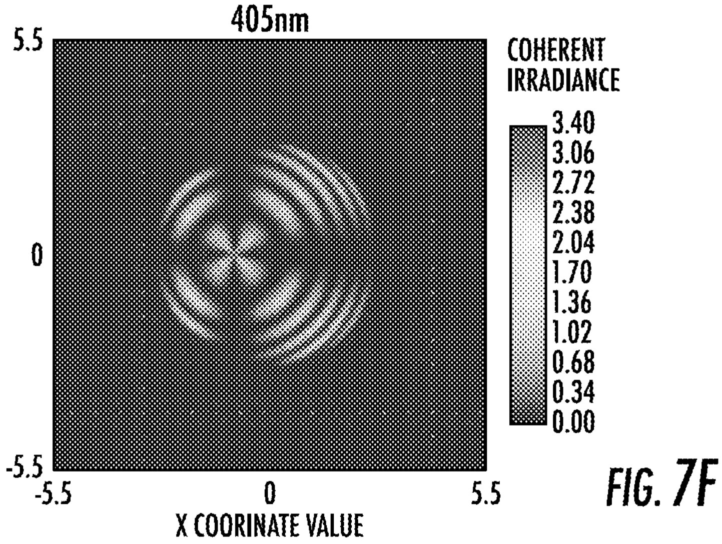
FIG. 7F is a simulated conoscopy pattern for a 4H SiC illuminated with 405 nm wavelength radiation using the software of FIG. 7D.

FIG. 7D, FIG. 7E, and FIG. 7F show the results of simulated conoscopy patterns for 550 nm, 450 nm, and 405 nm wavelengths, respectively, using commercially available optical software. In this example, the resolution improves as wavelength is decreased, but even at 550 nm, the resolution is sufficient to determine the crystal orientation with the needed precision for practical implementation.

Figure 8:
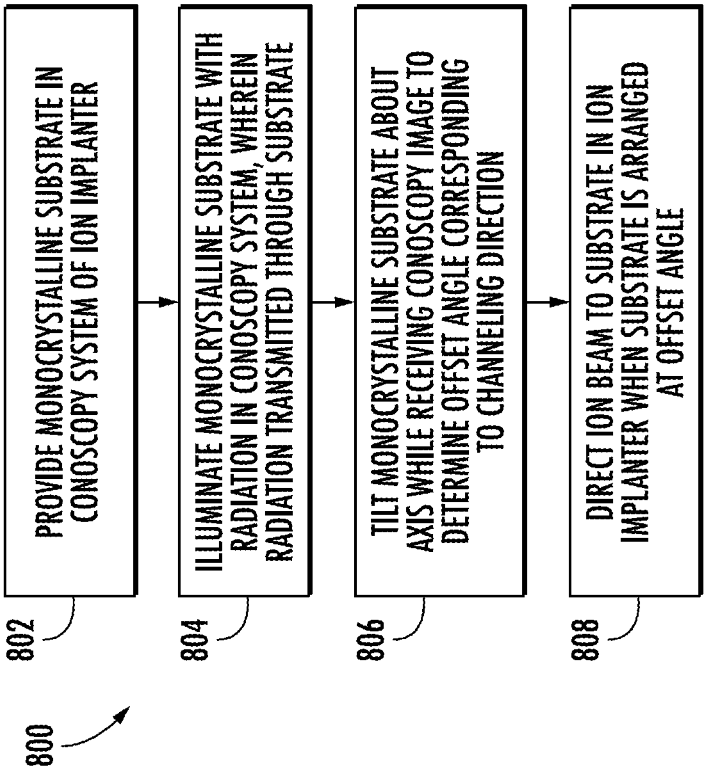
FIG. 8 depicts an exemplary process flow.

FIG. 8 depicts an exemplary process flow 800. At block 802, a monocrystalline substrate is provided in a conoscopy system of an ion implanter. In one example, the monocrystalline substrate may be a birefringent substrate, such as 4H SiC. At block 804, the monocrystalline substrate is illuminated with radiation in a conoscopy system, wherein the radiation is transmitted through the substrate. In some non-limiting embodiments, the wavelength of the radiation may lie between 550 nm and 375 nm.

At block 806, the monocrystalline substrate is tilted about an axis to provide different orientations of the substrate, while a conoscopy image is received at the different orientations. In so doing, an offset angle may be determined for the substrate that corresponds to a channeling direction for ions being implanted into the substrate. Said differently, the offset angle may correspond to an offcut angle of a substrate with respect to a c-axis of the crystalline lattice of the substrate.

At block 808, an ion beam is directed to the substrate in the ion implanter while the substrate is arranged at the offset angle.

FIG. 9 depicts another exemplary process flow 900. At block 902, a monocrystalline substrate is provided in a conoscopy system of an ion implanter. In one example, the monocrystalline substrate may be a birefringent substrate, such as 4H SiC. At block 904, the monocrystalline substrate is illuminated with light in a conoscopy system, wherein the light is transmitted through the substrate. In some non-limiting embodiments, the wavelength of the radiation may lie between 550 nm and 375 nm.

At block 906, a conoscopic image of the monocrystalline substrate, based upon the operation of block 904, is interpreted to determine an offset angle corresponding to a channeling direction of the monocrystalline substrate.

At block 908, an ion beam is directed to the monocrystalline substrate in the ion implanter while the substrate is arranged at the offset angle.

While some of the aforementioned embodiments may apply to measuring wafer alignment in a conoscopy system using a single wavelength of light (monochromatic radiation), in other embodiments, two, three or a larger number of single wavelengths of light may be employed. In some embodiments, polychromatic radiation may be employed. The use of a single wavelength, multiple single wavelengths or polychromatic illumination or any combination thereof, may be employed concurrently or alternating between light sources as to allow image capture of each light source separately. In some embodiments, light filter may be employed, including but not limited to high pass, low pass, band pass, band stop, any combination thereof or other. The filters may be used consistently or on a filter wheel, or similar apparatus, allowing for alternating between different filters and no filter options.

Figure 10:
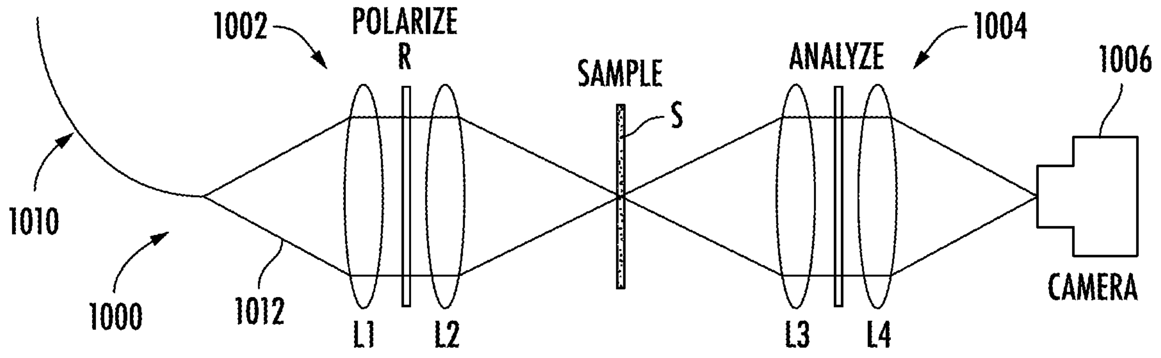
FIG. 10 depicts an example of a conoscopy system, according to further embodiments of the disclosure.

FIG. 10 depicts an example of a conoscopy system, according to further embodiments of the disclosure. In this example, the conoscopy system 1000 is arranged with a light source 1010 that directs light through a polarizer assembly 1002. The polarizer assembly 1002 may include, in addition to a first polarizer element (shown as 'polarizer') a lens L1 and lens L2 that focus light 1012, received from the light source 1010. The light 1012 may be focused on a sample plane of a substrate S, and may then be transmitted to analyzer assembly 1004. Again, the analyzer assembly 1004 may include, in addition to a second polarizer element (shown as 'analyzer'), a lens L3 and Lens L4 that focus the light 1012 at a camera 1006. In some non-limiting embodiments, the camera 1006 may be a solid state detector, such as a CMOS detector, a charge coupled device (CCD), and so forth. In some embodiments, the camera 1006 may be aligned perpendicularly to the axis of the conoscopy system 1000, or may be aligned at a non-zero angle with respect to the perpendicular. Note that in the case of an off-axis tilt, the index of refraction should be taken into account. In some embodiments, the substrate can be placed on a stage with a set tilt angle with respect to the incident light. In some embodiments, the set tilt angle would center the conoscopic image on the imaging sensor/camera. For example, for SiC the tilt angle is approximately 4 degrees, so the set tilt can be set in this instance, but not limited to, 4 degrees+ (the angle of refraction of the incident light through SiC), which total tilt will center the conoscopic image to be measured by the camera. Realignment of the optical axis would be compensated to account for the thickness and index of refraction of the substrate.

Figure 11:
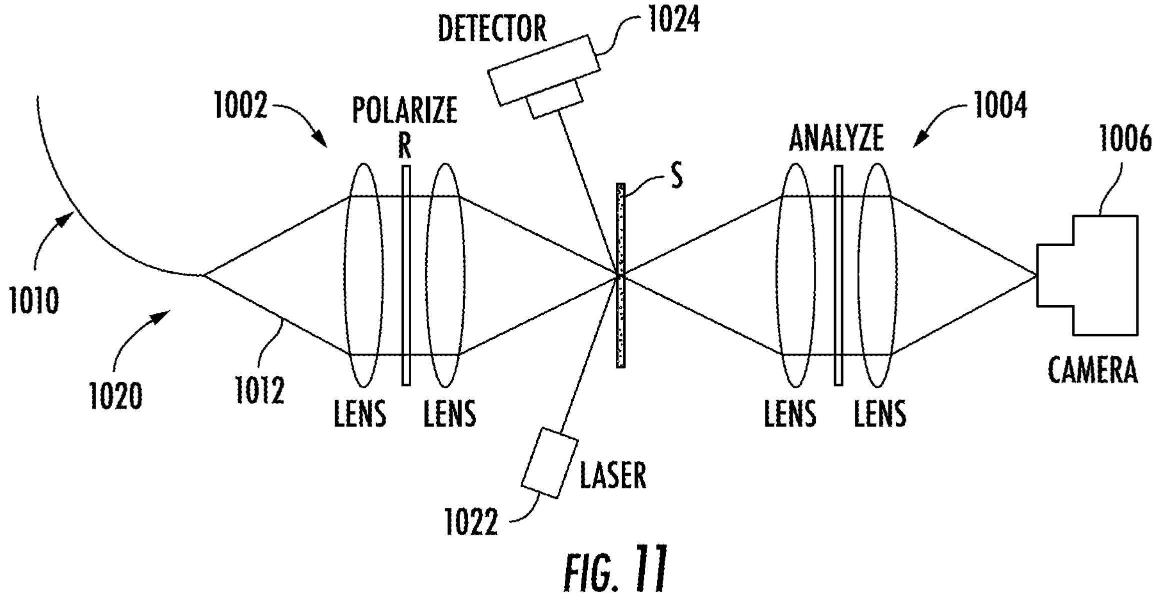
FIG. 11 depicts an example of another conoscopy system, according to additional embodiments of the disclosure.

FIG. 11 depicts an example of another conoscopy system, according to additional embodiments of the disclosure. The conoscopy system 1020 may be arranged similarly to conoscopy system 1000, with like parts the labeled the same. The conoscopy system 1020 may further include a laser source 1022 and a detector 1024, where the laser source 1022 directs an incident laser beam that acts as a probe beam that is reflected from the surface of the substrate S, to be received at the detector 1024. The conoscopy system 1020 may also include additional components, including but not limited to lenses and spatial filters. The laser source 1022 and detector 1024 may be used to determine whether the location on the substrate S where the light 1012 strikes is locally flat. This type of local curvature information is useful, because the crystalline alignment determined by a conoscopy measurement is determined over a relatively small area of the substrate S. Thus, local substrate curvature at the region P where the light 1012 is focused on substrate S may affect the conoscopy measurement. In other words, if the substrate at region P does not extend parallel to an expected substrate plane, this misalignment will affect the conoscopy measurement and may produce an erroneous offset angle for the substrate. For example, if the curvature at the measured region P is tilted by 0.1 degree in a specific direction, this curvature will be added to the intrinsic crystal orientation measured using the conoscopic imaging. Thus, if the curvature is not taken into account, the systemic error in estimated tilt angle will be 0.1 degree, which error may lie beyond the needed precision for practical implementation. By taking these local curvature effects into account, the offset angle a given monocrystalline substrate may be determined to a precision of 0.1 degrees or better.

In particular, the conoscopy system 1020 will measure the flatness of the substrate at a conoscopic illumination spot in region P, and with respect to the optical axis of the optical conoscopic imaging subsystem. In some embodiments, as illustrated in FIG. 11, the flatness can be measured directly using a laser reflected from the substrate and the reflected beam measured by a detector, such as a camera, on the other side. Any deviation of angle theta between the laser and the substrate from flatness, will result in a deviation of 2 times theta recorded in the detector. Given that the substrate can deviate in two different rocking directions, the detector can be itself two dimensional and account for both angles, or alternatively two laser and two linear or two dimensional detectors can be used perpendicular to each other. The flatness information can then be registered and incorporated into the analysis of the conoscopic imaging system to compensate for the lack of flatness of the substrate at the spot of measurement.

Figure 12A:
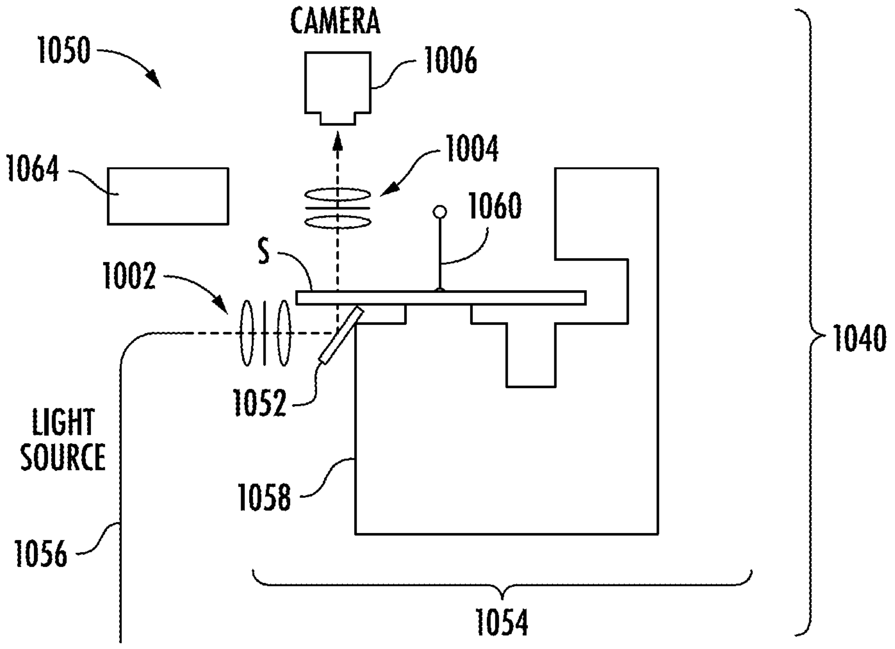
FIG. 12A depicts an example of an optical module, according to other embodiments of the disclosure.

FIG. 12A depicts an example of an optical module 1040 including a further conoscopy system 1050, according to other embodiments of the disclosure. The conoscopy system 1050 may be located in any suitable chamber of an ion implantation system according to some non-limiting embodiments. In one embodiment, the conoscopy system is part of a pre-aligner module that is coupled to a process chamber of an ion implanter. The optical module 1040 includes a substrate stage 1054 that may include a rotation component and a tilt component to manipulate the substrate S, so at to tilt the substrate S and rotate the substrate S about an axis 1060. The conoscopy system 1050 further includes a polarizer assembly 1002, an analyzer assembly 1004, such as the components described above. The conoscopy system 1050 further includes a light source 1056, such as a laser, laser diode, LED, or other, coupled to an optical fiber, to direct radiation through the polarizer assembly 1002. The conoscopy system further includes an angled mirror, disposed to receive light after passing through the polarizer assembly 1002, and to reflect the light through the substrate S and the analyzer assembly 1004, to be received by the camera 1006. Thus, the conoscopy system 1050 may provide a suitable approach to manipulate the substrate S and readily determine offset angle in a substrate S before loading into an implantation end station for ion implantation.

The substrate stage 1054 may include a mechanical stage with substrate handling and high-precision marking determination optical system. The mechanical stage includes rotation and translation of the substrate. The mechanical precision can accommodate the required precision of overall metrology measurement, including up to a single micrometer precision and repeatability. The mechanical substrate handling includes mechanical clamping of the substrate by various techniques, including but not limited to vacuum suction, mechanical clamping, electrostatic chuck, or other depending on the location of the module and other considerations. The mechanical substrate handling should allow a part of the substrate to be exposed and free hanging to enable a measurement spot for the optical conoscopic imaging. A pedestal 1058 illustrated in FIG. 12A should be smaller than the diameter of the substrate S, including but not limited to one third or the substrate diameter, one half of the substrate diameter, or other. The mechanical substrate handling may also flatten the substrate, thus improving the optical measurement of both the conoscopic measurement and the marking determination optical measurement. A high-precision marking determination optical system 1064 is provided to measure the twist orientation marking of the substrate, such as a flat, a notch, or other marking.

The marking determination precision can accommodate the required precision of overall metrology measurement, including up to 0.001 deg precision and repeatability. In order to achieve high translation placement precision of the substrate, it is possible for the substrate handling to place the substrate on the mechanical stage and measure the placement of the substrate using the marking determination optical system. If there is deviation from the optimal alignment, the substrate can be repositioned, based on the measurement to achieve the required placement precision. In some examples, the tilting of the substrate stage 1054 may be controlled to a tilt precision of 0.05 degrees or better, and the rotating of the substrate stage may be controlled to a twist precision of 0.5 degrees or better.

As noted previously, determination of the proper substrate orientation for channeling implantation involves both determining the proper tilt angle to tilt a substrate for proper channeling, as well as the proper twist angle. For substrates, such as semiconductor wafers, including 4H SiC, the nominal twist angle may be near 90 degrees. Because of the three-dimensional geometry of the crystalline lattice of the semiconductor wafer, the sensitivity to misalignment in twist angle is approximately 14 times less than the sensitivity to misalignment in tilt angle, Thus, the proper twist angle determination to within one degree or so may be sufficient to properly align a substrate.

Figure 12B:
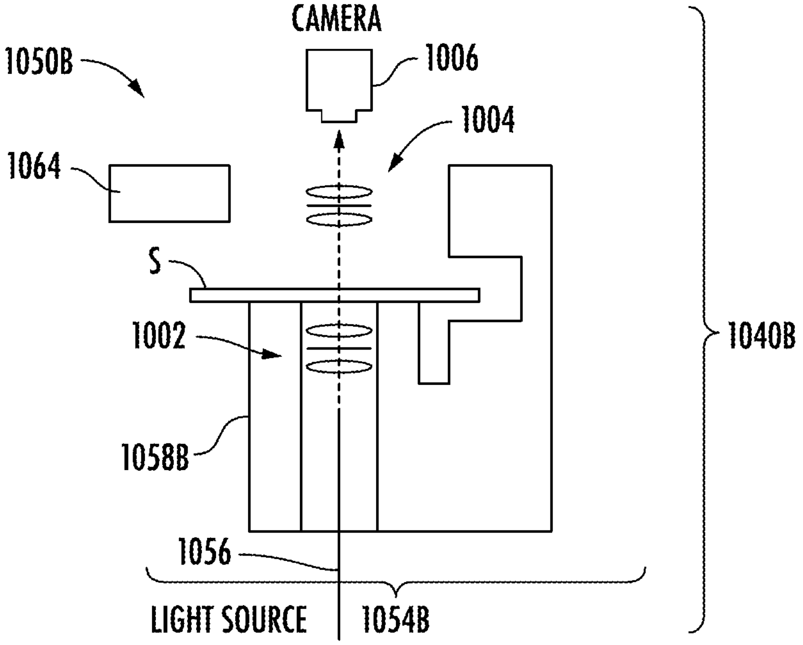
FIG. 12B depicts another example of an optical module, according to additional embodiments of the disclosure.

FIG. 12B depicts another example of an optical module 1040B including a further conoscopy system 1050, according to other embodiments of the disclosure. In this embodiment, the substrate stage 1054B includes a pedestal 1058B, configured differently from pedestal 1058. the conoscopic measurement is conducted in the center of the substrate S, with a hollow bore at the center of the pedestal 1058B to allow optical path and components access to the center of the substrate S. Measurement at the center of the substrate S is likely to have less curvature distortions with or without additional flattening of the substrate S, allowing for multiple conoscopy imaging measurements at the same spot to increase precision and other advantages. The integration of the marking determination optical system and mechanical clamping is similar to those features as described for the FIG. 12A embodiment.

Figure 13:
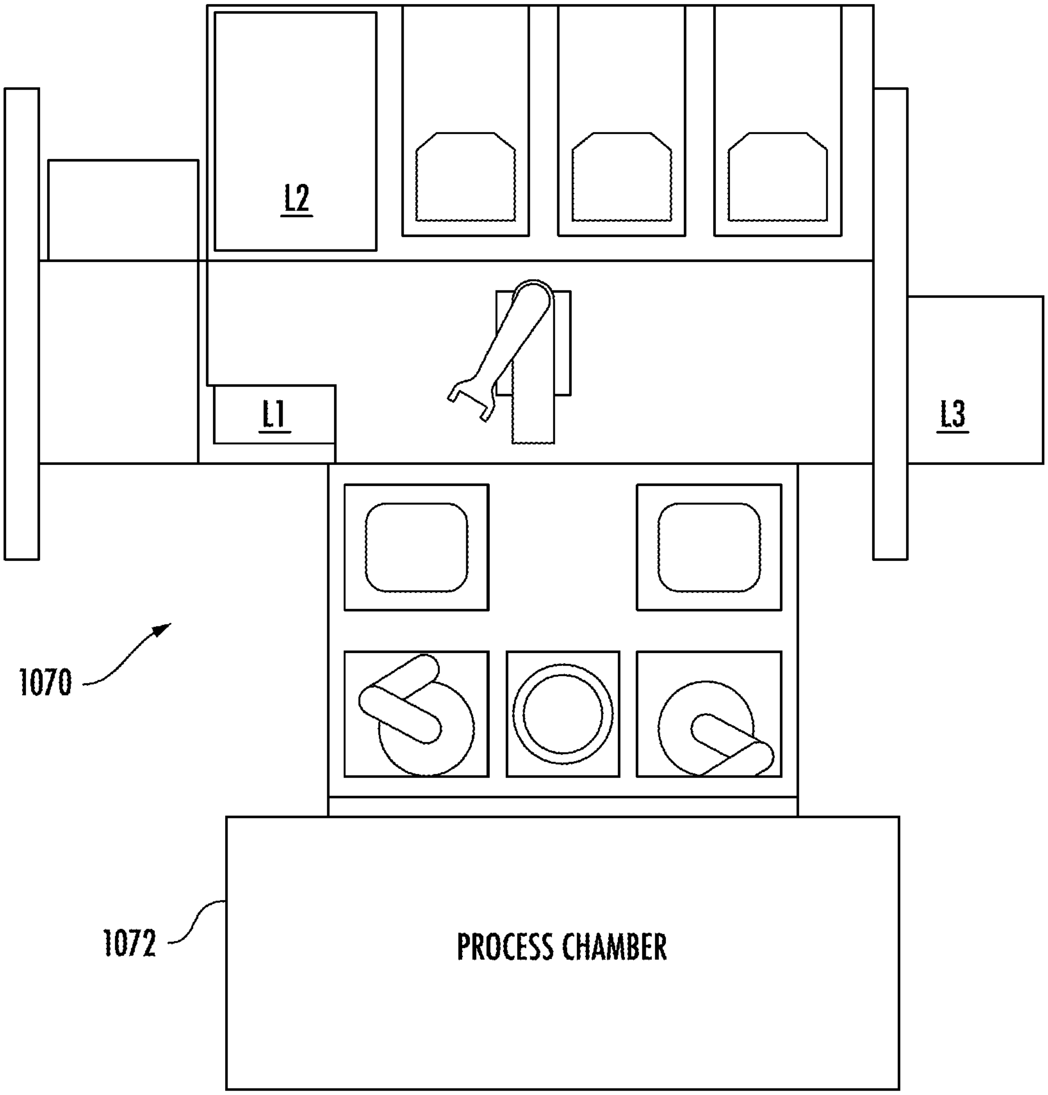
FIG. 13 depicts alternative end station configurations, according to various embodiments of the disclosure.

FIG. 13 depicts an example architecture of an end station 1070, illustrating various alternative configurations for providing a location of an optical metrology module based upon a conoscopic system. In this example, some suitable locations are indicated, which locations may be ‘external locations’ that are situated inside the end station 1070, but are located external to a process chamber 1072. Note that in this embodiment, the end station 1070 is deemed to constitute components and chambers that may communicate directly or indirectly with the process chamber 1072, but do not include the process chamber 1072. The external location can be, but not limited to, inside an EFEM module, in proximity to a robot, denoted as “Location L1”, at the load port, denoted as “Location L2,” or outside and to the side of the EFEM with access to the EFEM, denoted as “Location L3”. The implementation of the conoscopic imaging, the optical determination of the substrate marking, and other features such as the flatness measurement, can also be implemented in and around the orienter in vacuum environment. Operating in vacuum environment would not allow the use of vacuum suction clamping of the wafer, so other clamping techniques may be used. The optical windows on the top and bottom of the orienter module will be used as access points for the optics, as well as miniaturizing the optical components to fit inside in the vacuum chamber with the right form factor to allow the normal operation of the orienter and enable the optical conoscopic measurement.

In some embodiments, the optical conoscopic measurement will have to be calibrated to maintain alignment and compensate for mechanical drifts and imperfections. The use of a calibration substrate can be used. The calibration substrate may be any material having uniaxial birefringence such as quartz, sapphire, calcite, SiC or other material. The crystal orientation of the calibration material may be validated using XRD measurement of the crystal orientation as a reference. Another calibration procedure includes the calibration substrate to be with 0 degrees to optical axis, including some errors in the cut of the crystal, and conoscopic measurement of the calibration substrate at different twist angles to compensate for any small miscut deviation from true 0 degrees. This procedure will provide the true zero of the conoscopic system.

In some embodiments, the optical conoscopic measurement may be further calibrated to compensate optical deviation which deviation can occur even with true zero calibration. These deviations include non-linearity of the conoscopic image as recorded on the sensor and actual crystal orientation. One direct way to calibrate for these deviations is to measure several substrates using XRD measurement of crystal orientation as a reference and cross reference the results to optical conoscopic measurements of the same substrates. The number of substrates that are to be measured would be determined by the scale of the non-linear deviation and the precision required for determination of tilt and twist angles.

In some embodiments, the optical metrology module may be used in a stand-alone metrology tool. Like stand-alone XRD crystal orientation metrology tools, the stand-alone optical metrology tool may include load ports for substrate batches or FOUPs (front opening unified pos), mechanical handling of the substrates to the optical metrology module and back to the load ports, data analysis, storage and communication of the crystal orientation of each measured substrate to external connections, such as an implanter or the fabrication facility centralized software management platform.

Figure 14:
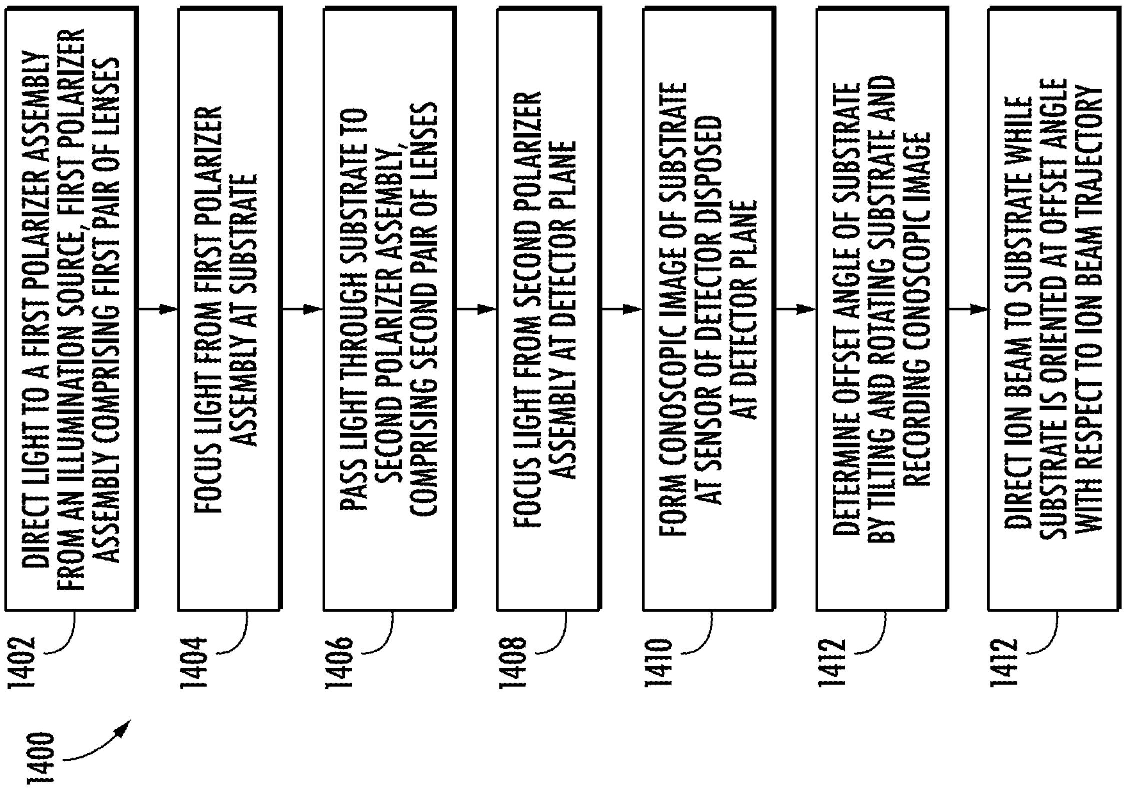
FIG. 14 depicts another exemplary process flow.

FIG. 14 depicts another exemplary process flow 1400. At block 1402, light is directed to a first polarizer assembly from an illumination source, where first polarizer assembly comprises a first pair of lenses. The wavelength of the light may range from 550 nm to 375 nm according to various non-limiting embodiments. At block 1404 the light is focused at a substrate position. At block 1406, the light is passed through a second polarizer assembly having a second pair of lenses. At block 1408, light passing from the second polarizer assembly is focused at a detector plane. At block 1410, a sensor of a detector that is arranged at the detector plane forms a conoscopic image of the substrate. At block 1412, and offset angle of the substrate is determined by tilting and rotating the substrate through a series of orientations, and recording a conoscopic image as determined by blocks 1402-1410, for the series of orientations of the substrate. At block 1414, and ion beam is directed to the substrate while the substrate is oriented at the offset angle with respect to the ion beam trajectory.

Figure 15:
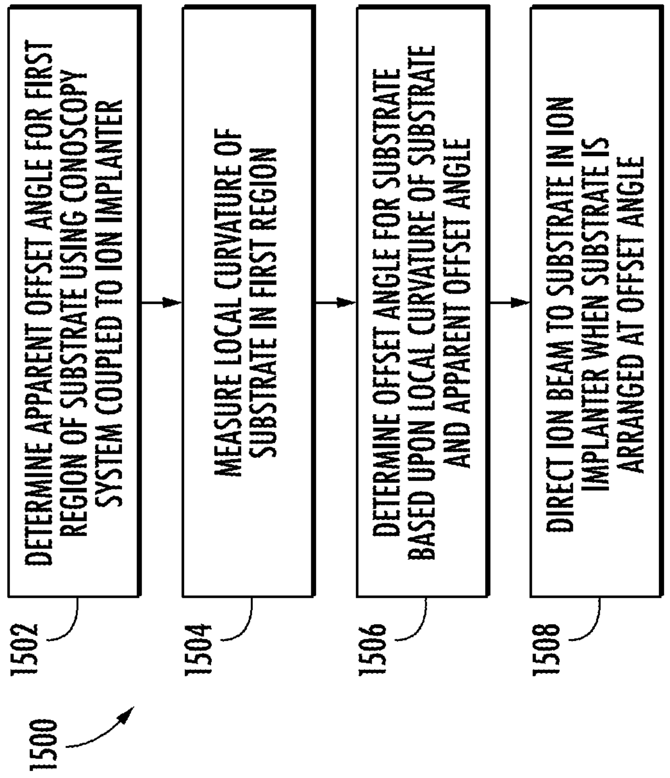
FIG. 15 depicts yet another exemplary process flow.

FIG. 15 depicts yet another exemplary process flow 1500. At block 102, an apparent offset angle is determined for a first region of a substrate using a conoscopy system coupled to an ion implanter. At block 1504 a local curvature of the substrate is measured in the first region. At block 1506, and offset angle is determined for the substrate based upon the local curvature of substrate and the apparent offset angle. At block 1508, an ion beam is directed to the substrate in an ion implanter when the substrate is arranged at the offset angle.

As a first advantage, the present embodiments provide an optical module that can measure at low-cost and high precision the crystal orientation of materials with birefringence and suitable transparency, such as 4H-SiC, and other materials. Some embodiments provide a flexible module including different optical set-ups and configuration for conoscopic imaging including with and without tilting the substrate, illumination with a single wavelength, multiple single wavelengths, polychromatic illumination or combination thereof, measurement at different spots on the substrate, at the center of the substrate, or combination thereof. Another advantage of the present embodiments is the analysis of a conoscopic interference image or images to retrieve sub-pixel precision. The present embodiments further provide complementary subsystems allowing for high-precision marking determination optical system, procedure for high-precision substrate translation placement, optical curvature measurement at the conoscopic measurement spot to avoid systemic error of crystal orientation measurement, and substrate handling and clamping with or without additional flattening of the substrate. A further advantage provided by the present embodiments is the broadening of the applicability for the optical module integration in an ion implanter in various locations. Additionally, the present embodiments provide a stand-alone full system based on the conoscopic imaging approach and complementary subsystem that can work independently from an implanter.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion implanter, comprising:

an ion source to generate an ion beam;

a set of beamline components to direct the ion beam to a substrate along a beam axis that is normal to a reference plane;

a process chamber to house the substrate to receive the ion beam; and a conoscopy system, disposed within the ion implanter, and comprising:

an illumination source to direct light to a substrate position;

a first polarizer assembly, being disposed between the illumination source and the substrate position, and comprising a first polarizer element and a first pair of lenses that are disposed on opposite sides of the first polarizer element, the first pair of lenses arranged to focus the light at the substrate position;

a second polarizer assembly, the second polarizer assembly being disposed to receive the light after passing through the substrate position, the second polarizer comprising a second polarizer element and a second pair of lenses disposed on opposite sides of the second polarizer element, the second pair of lenses arranged to focus the light at a detector plane; and a detector, to detect the light after passing through the lens, the detector having a sensor that is disposed at the detector plane.

2. The ion implanter of claim 1, wherein the conoscopy system further comprises:

a substrate stage, the substrate stage to hold the substrate at the substrate position, wherein the conoscopy system is configured to determine an offset angle of the substrate, according to a detected image of the light that is formed at the detector.

3. The ion implanter of claim 2, wherein the light forms a symmetrical pattern at the detector when the substrate is tilted at the offset angle, wherein a c-axis of the substrate is aligned along the beam axis.

4. The ion implanter of claim 2, wherein the conoscopy system is configured to determine a value of the offset angle to within 0.1 degrees, wherein a tilting of the substrate stage is controlled to a tilt precision of 0.05 degrees or better, and wherein a rotating of the substrate stage is controlled to a twist precision of 0.5 degrees or better.

5. The ion implanter of claim 2, wherein the light is focused in a first region of the substrate, the conoscopy system further comprising:

a measurement system to measure a local curvature of the substrate at the first region, wherein a tilting of the substrate is based upon the offset angle and the local curvature.

6. The ion implanter of claim 5, wherein the curvature measurement system comprises:

a laser source to direct an incident laser beam to the first region; and a detector to receive the laser beam after reflection from the first region.

7. The ion implanter of claim 1, wherein the conoscopy system is in an end station, in a location that is external to the process chamber, wherein the conoscopy system further comprises a mirror, the mirror being disposed to receive light from the first polarizer, and to reflect the light through the substrate to the second polarizer.

8. The ion implanter of claim 2, wherein the conoscopy system is disposed outside of a process chamber in an end station, wherein the substrate stage comprises a tilt component to tilt the substrate within the end station, wherein the substrate presents a channeling direction to the ion beam when the substrate is tilted at the offset angle with respect to the ion beam.

9. A method of implanting a substrate, comprising:

determining an offset angle for the substrate using a conoscopy system coupled to ion implanter, and generating an ion beam in the ion implanter;

directing the ion beam to a substrate along a beam trajectory; and tilting the substrate with respect to the beam trajectory based upon the offset angle, when the ion beam impinges upon the substrate.

10. The method of claim 9, the conoscopy system comprising:

an illumination source to direct light to the substrate;

a first polarizer assembly, being disposed between the illumination source and the substrate position, and comprising a first polarizer element and a first pair of lenses that are disposed on opposite sides of the first polarizer element, the first pair of lenses arranged to focus the light at the substrate position;

a second polarizer assembly, the second polarizer assembly being disposed to receive the light after passing through the substrate, the second polarizer comprising a second polarizer element and a second pair of lenses disposed on opposite sides of the second polarizer element, the second pair of lenses arranged to focus the light at a detector plane; and a detector, to detect the light after passing through the lens, the detector having a sensor that is disposed at the detector plane.

11. The method of claim 10, wherein the light forms a symmetrical pattern at the detector when the substrate is tilted at the offset angle, wherein a c-axis of the substrate is aligned along a trajectory of the light at the substrate.

12. The method of claim 9, wherein the substrate presents a channeling orientation to the ion beam when the substrate is tilted at the offset angle.

13. The method of claim 9, wherein the conoscopy system further comprises a rotation component to provide a rotating of the substrate through a twist angle, where the conoscopy system is configured to determine a value of the offset angle to within 0.1 degrees, wherein the tilting is controlled to a tilt precision of 0.05 degrees or better, and wherein the rotating is controlled to a twist precision of 0.5 degrees or better.

14. The method of claim 9, wherein the ion beam impinges upon the substrate in a process chamber, wherein the conoscopy system is disposed outside of the process chamber, the method further comprising:

transferring the substrate from the conoscopy system to a substrate holder in the process chamber; and tilting and rotating the substrate on the substrate holder so that the substrate is tilted at the offset angle, wherein the ion beam impinges on the substrate along a beam trajectory that defines the offset angle with respect to the beam trajectory.

15. The method of claim 13, wherein the light is focused in a first region of the substrate, the method further comprising:

measuring a local curvature of the substrate in the first region, wherein the tilting and rotating of the substrate is based upon the offset angle and the local curvature.

16. The method of claim 15, wherein the measuring the local curvature comprises:

directing a laser beam as an incident laser beam to the first region; and detecting the laser beam after reflection from the first region.

17. The method of claim 9, wherein the substrate is 4H-SiC.

18. The method of claim 9, wherein the light comprises radiation having a wavelength between 375 nm and 550 nm.

19. An optical module, for orienting a substrate in an ion implanter, comprising:

an illumination source to direct light to a substrate position;

a first polarizer assembly, disposed between the illumination source and the substrate position, and comprising a first polarizer element and a first pair of lenses that are disposed on opposite sides of the first polarizer element, and are arranged to focus the light at the substrate position;

a second polarizer assembly, the second polarizer assembly being disposed to receive the light after passing through the substrate position, the second polarizer comprising a second polarizer element and a second pair of lenses disposed on opposite sides of the second polarizer element, and are arranged to focus the light at a detector plane; and a detector, to detect the light after passing through the lens, the detector having a sensor that is disposed at the detector plane.

20. The optical module of claim 19, further comprising: a substrate stage to support the substrate, wherein the optical module is disposed within the ion implanter, in a location external to a process chamber of the ion implanter.

* * * * *